United States Patent [19]

Chyung

[11] 4,385,127
[45] May 24, 1983

[54] GLASS-CERAMIC COATINGS FOR USE ON METAL SUBSTRATES

[75] Inventor: Kenneth Chyung, Painted Post, N.Y.

[73] Assignee: Corning Glass Works, Corning, N.Y.

[21] Appl. No.: 323,879

[22] Filed: Nov. 23, 1981

[51] Int. Cl.$^3$ .............................................. C03C 3/22
[52] U.S. Cl. ........................................ 501/5; 501/8;
 501/65; 501/66; 501/67; 501/77; 501/79
[58] Field of Search ............... 501/5, 8, 9, 65, 66, 501/67, 79, 77

[56] References Cited

U.S. PATENT DOCUMENTS 3,022,179 2/1962 Morrissey ............................... 501/5
3,848,079 11/1974 Amin ...................................... 501/5
4,256,796 3/1981 Hang et al. ............................. 501/5

Primary Examiner—Mark Bell
Attorney, Agent, or Firm—Clinton S. Janes, Jr.

[57] ABSTRACT

The instant invention is concerned with the preparation of glass-ceramic coatings capable of being fired repeatedly to temperatures in excess of 950° C. without thermal deformation and being particularly suitable for application to low carbon and titanium-stabilized stainless steels. The coatings are substantially free from alkali metal oxides and consist essentially, expressed in terms of weight percent on the oxide basis, of:

| | |
|---|---|
| BaO | 10–60 |
| $B_2O_3$ | 5–30 |
| $SiO_2$ | 25–40 |
| $Al_2O_3$ | 0–15 |
| CaO | 0–15 |
| MgO | 10–35 |
| ZnO | 0–16 |
| $Al_2O_3$ + CaO + ZnO | 5–20 |

2 Claims, No Drawings

GLASS-CERAMIC COATINGS FOR USE ON METAL SUBSTRATES

BACKGROUND OF THE INVENTION

U.S. application Ser. No. 323,920, filed concurrently herewith in the names of Ronald L. Andrus, Kenneth Chyung, and Richard F. Reade under the same title as the instant application, provides a discussion of the development of electronic circuit boards. Thus, as is explained therein, circuit boards are essentially a substrate coated with a dielectric material upon the surface of which is applied the desired conductive metal circuitry. The substrates or boards, as they have been familiarly termed, have customarily been fabricated from three general categories of materials, viz., organic plastics, ceramic wafers, and porcelain-coated steel. That application describes the deficiencies and shortcomings exhibited by each of those materials.

That application also reviews the disclosure of U.S. Pat. No. 4,256,796 which is drawn to the fabrication of porcelain-coated, metal circuit boards wherein the "porcelain" is a devitrified glass having a composition which is substantially free from alkali metal oxide and consists essentially, expressed in terms of mole percent on the oxide basis, of

|   |   |
|---|---|
| BaO | 6-25 |
| MgO + optionally CaO and/or ZnO | 30-60 |
| $B_2O_3$ | 13-35 |
| $SiO_2$ | 10-25 |

Whereas a direct conversion cannot be made of ranges expressed in mole percent to ranges stated in weight percent, the following table sets forth an approximation of the disclosed compositions (also utilizing the exemplary compositions tabulated in the patent) in terms of weight percent.

|   |   |
|---|---|
| BaO | 16-50 |
| MgO | 16-42 |
| CaO | 0-11 |
| ZnO | 0-11 |
| CaO + ZnO | 0-11 |
| $B_2O_3$ | 12-34 |
| $SiO_2$ | 10-23 |
| $ZrO_2$ | 0-5 |
| $Al_2O_3$ | 0-5 |
| $SnO_2$ | 0-5 |
| $ZrO_2 + Al_2O_3 + SnO_2$ | 0-5 |

The patent describes melting batches for the above compositions, forming glass frits from the melts, applying a coating of the frits onto the surface of a metal substrate (most preferably low carbon steel), and then firing the coated substrate at a temperature of at least 750° C., more desirably 800°-850° C., for a period of time sufficient to cause the frit to essentially simultaneously sinter together to an integral mass and crystallize in situ, this time commonly ranging from 5-30 minutes. The resultant coating is highly crystalline, i.e., about 50-90% by volume crystalline, with residual glass comprising the remainder thereof. The primary crystal phase is $BaO.2MO.2SiO_2$, wherein MO consists of MgO with, optionally, CaO and/or ZnO. $2MO.B_2O_3$ constitutes the secondary crystal phase wherein MO again consists of MgO with, optionally, CaO and/or ZnO. The final coatings demonstrate high coefficients of thermal expansion, typically $110 \times 10^{-7}/°C$. and above, over the interval of 0° C. to the deformation temperature of the material (>700° C.). Such coefficients of thermal expansion are useful in matching the high coefficients of thermal expansion of the metal substrates employed, e.g., the preferred low carbon steels.

Application Ser. No. 323,920, supra, discloses glass-ceramic coatings capable of being applied to metal substrates which are more refractory than the coatings of Pat. No. 4,256,796 and demonstrate coefficients of thermal expansion (25°-600° C.) ranging between about $80-125 \times 10^{-7}/°C$. Those coatings are essentially free from alkali metal oxides and consist essentially, expressed in terms of weight percent on the oxide basis, of

|   |   |
|---|---|
| MgO | 5-35 |
| CaO | 0-35 |
| ZnO | 0-15 |
| CaO + ZnO | 10-35 |
| $Al_2O_3$ | 0-10 |
| $B_2O_3$ | 0-25 |
| $SiO_2$ | 25-50 |
| $P_2O_5$ | 0-10 |
| $B_2O_3 + P_2O_5$ | 4-25 |

The coatings are prepared in a manner similar to that described in U.S. Pat. No. 4,256,796 but the combined sintering and crystallizing step is carried out at temperatures of at least 850° C. The crystal phases generated are dependent upon the presence of CaO and/or ZnO. The occurrence of such phases as diopside ($CaO.MgO.2SiO_2$), magnesium borate ($2MgO.B_2O_3$), willemite ($2ZnO.SiO_2$), akermanite ($2CaO.MgO.2SiO_2$) and enstatite ($MgO.SiO_2$) is noted. The coatings can be fired to temperatures up to and in excess of 1000° C. with no deformation or other deleterious effect being observed.

SUMMARY OF THE INVENTION

The instant invention is directed to the production of glass-ceramics capable of being fired repeatedly to temperatures greater than 950° C. without undergoing thermal deformation and exhibiting coefficients of thermal expansion (25°-600° C.) between about $75-150 \times 10^{-7}/°C$., which coatings are suitable for use on metal substrates, have compositions essentially free from alkali metal oxides, and are included within a base $BaO-MgO-B_2O_3-SiO_2$ field with at least one metal oxide selected from the group of $Al_2O_3$, CaO, and ZnO. Thus, the coatings consist essentially, expressed in terms of weight percent on the oxide basis, of

|   |   |
|---|---|
| BaO | 10-60 |
| $B_2O_3$ | 5-30 |
| $SiO_2$ | 25-40 |
| $Al_2O_3$ | 0-15 |
| CaO | 0-15 |
| MgO | 10-35 |
| ZnO | 0-16 |
| $Al_2O_3 + CaO + ZnO$ | 5-20 |

The nature of the crystal phases present in the final coatings is a function of the identity and quantity of optional metal oxides in the composition. For example, if a substantial amount of $Al_2O_3$ is present and the other optional ingredients are absent or are included in only small concentrations, then hexacelsian ($BaO.Al_2O_3.2SiO_2$) will be the predominant phase developed. In contrast, where MgO is a substantial component and the other optional metal oxides are absent or present at only minor levels, BaO.2MgO.2SiO$_2$ will comprise the predominant phase. A preferred range of compositions consists of

|  |  |
|---|---|
| BaO | 10–40 |
| B$_2$O$_3$ | 6–15 |
| SiO$_2$ | 25–38 |
| MgO | 10–30 |
| CaO | 0–15 |
| ZnO | 0–16 |
| Al$_2$O$_3$ | 0–10 |
| CaO + ZnO + Al$_2$O$_3$ | 5–18 |

The coatings resulting therefrom contain BaO.2MgO.2SiO$_2$ as the primary crystal phase, they can be fired to temperatures in excess of 950° C. with no deformation or other adverse effect being noted, and they exhibit coefficients of thermal expansion (25°–600° C.) between about $120-140 \times 10^{-7}/°C$. That latter property renders them particularly useful as coatings for low carbon steels, such as Vitrenamel, marketed by U.S. Steel, Pittsburgh, Pa., and such titanium-stabilized steels as Ti-Namel, marketed by Inland Steel Company, Chicago, Ill., and titanium-stabilized 430 stainless steel, marketed by Carpenter Technology Corporation, Reading, Pa., which demonstrate coefficients of thermal expansion (25°–600° C.) of about $140-150 \times 10^{-7}/°C$.

The method for preparing and applying the inventive coatings comprises five basic steps:

First, a glass-forming batch of a predetermined formulation is melted;

Second, the melt is cooled to a glass and the glass comminuted to a fine powder or frit;

Third, a liquid slurry is prepared of the frit;

Fourth, the slurry is applied as a coating onto a surface of a substrate; and

Fifth, the coated substrate is fired to a temperature of at least 850° C. to essentially simultaneously fuse the frit particles together into an integral, substantially non-porous ("pinhole-free") coating and to cause extensive crystallization to take place in situ therein.

Customarily, to insure sufficient flow of the glass during sintering so as to develop an essentially non-porous coating and to generate a high volume of crystallinity, the glass frit will desirably be powdered to particles passing a 325 United States Standard Sieve (44 microns). Most preferably, the particles will range in size between about 5–20 microns in diameter. To expedite the pulverizing of the glass to a fine frit, a stream of the molten glass can be run into a pool of water ("drigaged") to break up into relatively small particles. Those particles can then be further reduced to the desired fineness.

An aqueous slurry can be prepared although for certain deposition techniques organic liquid vehicles are preferred. Frequently, organic vehicles evaporate more rapidly than water, thereby expediting the drying and subsequent fusing process. Moreover, organic vehicles have appeared to yield more sound, non-porous coatings with a wider variety of frit compositions than water.

Numerous procedures for applying slurries to substrates are well known to the art. For example, the slurry can simply be poured onto the substrate, the substrate can be immersed into the slurry, the slurry can be sprayed onto the surface of a substrate, or the slurry can be applied to a substrate via electrophoretic deposition. The latter two techniques are preferred because they customarily provide more uniform coatings. The operable concentrations of powder and vehicle are dependent upon the method employed to apply the slurry and can be readily determined empirically. To illustrate, where a slurry for spray coating is prepared utilizing a relatively volatile organic vehicle, e.g., 2-propanol, the content of liquid will be maintained between about 70–90 ml/100 grams of powder. Accordingly, when the quantity of vehicle is excessive, the deposited coating tends to run. Conversely, when the liquid content is too low, the inherent rapid evaporation of the vehicle leaves insufficient liquid and the deposited coating assumes a loose and fluffy character. Good uniformity and high density of the deposited coating are vital since flow during the firing operation is quite limited and any defects in the deposit manifest themselves after firing.

Firing of the deposited coatings will typically be carried out at temperatures of at least about 850° C. for periods of time sufficient to essentially simultaneously fuse the glass particles into an integral, substantially non-porous coating and effect extensive crystallization in situ therein. In general, a top firing temperature of about 1000° C. will be adequate to fuse the particles while avoiding excessive flow. Firing times will commonly vary from a few minutes at the upper extreme of the temperature range to about 15 minutes at the lower end thereof. Longer fusion times are operable but the final product does not appear to demonstrate such a significant improvement in character to warrant the additional expense attendant to an extended firing schedule.

The inventive materials appear to be unaffected by the environment present during the sintering process, but the substrate material, e.g., low carbon steel, may require the use of an inert or reducing atmosphere to prevent oxidation thereof. Also, the application of metallic copper and/or nickel coatings onto the substrates may be useful in preventing oxidation and promoting bonding of the inventive coating. However, the need for such conditions can again be readily determined empirically.

Minor amounts of compatible metal oxides such as SrO, ZrO$_2$, PbO, and Bi$_2$O$_3$ may be included so long as the coefficient of thermal expansion and/or the refractoriness of the coating are not altered significantly. Such additions will generally not exceed about 10%. Conventional glass colorants may also be added in customary amounts.

Description of the Preferred Embodiments

Table I below records a group of exemplary glasses, expressed in terms of parts by weight on the oxide basis, illustrative of compositions operable in the invention. Because the sum of the individual components totals or approximately totals 100, for all practical purposes the values reported may be deemed to represent weight percent. The actual batch ingredients may comprise any materials, either the oxide or other compound, which, when melted together with the other constituents, will be converted into the desired oxide in the proper proportions.

The batch components were compounded, ballmilled together to aid in achieving a homogeneous melt, and deposited into platinum crucibles. The crucibles were moved to a furnace operating at about 1350°–1450° C.

and the batches melted for about 4–6 hours. (The loss of $B_2O_3$ through volatilization has been estimated to range about 10%.) The melts were poured as a fine stream into a container of water to produce relatively fine particles of glass. Thereafter, those particles were dried and ballmilled to pass a 325 mesh screen.

TABLE I

|  | 1 | 2 | 3 | 4 | 5 | 6 | 7 | 8 | 9 |
|---|---|---|---|---|---|---|---|---|---|
| $SiO_2$ | 27.0 | 30.6 | 31.8 | 32.8 | 37.2 | 37.2 | 33.8 | 37.8 | 34.9 |
| BaO | 37.0 | 15.9 | 16.5 | 11.2 | 16.8 | 16.8 | 16.5 | 16.5 | 18.2 |
| $B_2O_3$ | 10.0 | 12.7 | 13.2 | 12.0 | 7.5 | 10.5 | 11.2 | 9.2 | 8.5 |
| $Al_2O_3$ | 3.0 | 3.8 | — | — | — | — | — | — | — |
| CaO | 10.0 | — | — | — | — | — | — | — | — |
| ZnO | — | 13.5 | 14.0 | 16.0 | 14.0 | 11.0 | 14.0 | 14.0 | 14.0 |
| MgO | 13.0 | 23.5 | 24.5 | 28.0 | 24.5 | 24.5 | 24.5 | 24.5 | 24.5 |

A simple test was devised to furnish a rather rough appraisal of the applicability of the compositions to provide desirable coatings. The method comprehended pressing circular buttons having diameters of about 0.5" and heights of about 0.5" from glass frit powdered to pass a 325 mesh screen combined with a small amount of vehicle. The buttons were plunged into a furnace operating at about 900°–950° C. and held therewithin for 25 minutes. Visual examination of the sintered buttons can evaluate the degree of flow, the extent of crystallization, the size of the crystals, and the surface quality developed. Compositions displaying good flow and extensive crystallization were subjected to x-ray diffraction analysis to identify the crystal phases present therein and coefficients of thermal expansion were measured on sintered pressed bars having dimensions of about $2'' \times 0.5'' \times 0.25''$.

A qualitative assessment of the degree of flow manifested by the buttons was carried out utilizing an arbitrary scale of 1–5 with increasing flow. On that scale 1 indicated sintering only with no flow, 2 signified slightly rounded edges with very little flow, 3 reflected rounded edges with good flow, 4 designated complete slumping of the button, i.e., high flow, and 5 marked the remains of a puddle of glass indicating very high flow. Experience has shown that the flow must exhibit a value of at least 3 on the above scale to be adequate to produce essentially "pinhole-free" coatings. A flow level of 2 may be improved in some compositions by increasing the firing temperature. Extending the time of fusing will normally not enhance the extent of flow inasmuch as the glasses tend to crystallize very rapidly. Thus, the flow taking place prior to crystallization constitutes the major proportion of flow at a given temperature.

Table II records a visual assessment of the degree of flow occurring in the above-described button test, a qualitative determination of the amount of crystallinity present (highly crystalline being considered as in excess of 50% by volume) and the average diameter of the crystals (fine=no more than 5 microns; medium=5–10 microns) as observed via electron microscopy, the identity of the crystal phases present as determined through x-ray diffraction analysis, and a measurement of the coefficient of thermal expansion over the range of 25°–600° C. ($\times 10^{-7}/°C$.) conducted on pressed, sintered bars utilizing techniques for such measurements conventional in the glass-ceramic art.

TABLE II

|  | 1 | 2 | 3 | 4 | 5 |
|---|---|---|---|---|---|
| Button Flow (900° C. - 25 min.) | 3–4 | 4–5 | 4–5 | 3–4 | 2–3 |
| Crystal Size | Med. | Med. | Med. | Med. | Fine |
| Crystallinity | Med. | Med. | High | High | High |
| Crystal Phases* | $BM_2S_2$ (S) G (M) | $BM_2S_2$ (S) | $BM_2S_2$ (S) | $BM_2S_2$ (S) | $BM_2S_2$ (S) |
| Coef. Exp. | 123 | — | 122 | 135 | 136 |

|  | 6 | 7 | 8 | 9 |
|---|---|---|---|---|
| Button Flow (900° C. - 0.25 hr) | 3–4 | 3–4 | 3–4 | 3–4 |
| Crystal Size | Med. | Med. | Med. | Med. |
| Crystallinity | High | High | High | High |
| Crystal Phases* | $BM_2S_2$ (VS) | $BM_2S_2$ (VS) MS (VW) | $BM_2S_2$ (VS) | $BM_2S_2$ (VS) MS (VW) |
| Coef. Exp. | 138 | 130 | 138 | 132 |

*G = Glass
$BM_2S_2$ = $BaO.2MgO.2SiO_2$
MS = $MgO.SiO_2$
VS=Very strong peak in the x-ray diffraction pattern,
S=Strong peak
M=Medium peak,
VW=Very weak peak.

An inspection of Table II in conjunction with Table I clearly illustrates the effect which glass composition exerts upon the crystallinity present in the fired product. Comminuting the frit to a smaller overall particle size and/or extending the length of time for sintering can enhance the amount of crystallinity generated.

As was observed above, the use of an organic vehicle has appeared to produce more uniform and sound coatings than an aqueous slurry. For example, operable suspensions of frits can be prepared from such liquids as methanol, ethanol, 1-propanol, 2-propanol, 1-butanol, 2-butanol, and amyl acetate with nitrocellulose binder. The best coatings with respect to density, uniformity, and rate of deposition have been prepared with 2-propanol.

Laboratory experience has indicated that 2-propanol slurries provide better deposits than 1-propanol and 2-butanol slurries better coatings than 1-butanol. The steric hindrance due to the absorbed molecule appears to make 2-propanol and 2-butanol more effective than 1-propanol and 1-butanol, respectively. The OH⁻ group is attached at the side of the carbon chain in 2-propanol rather than at the end thereof. It has been recognized that, generally, a side attachment of this type provides for a better suspension of particles therein.

The use of methanol as a vehicle yields an extremely rapid rate of deposition but frequently the resultant deposit tends to be rather loose such that the sintered coating is not as dense and uniform as would be desired.

Electrophoretic deposition has consistently appeared to produce the best coatings. However, that process must be conducted with essentially constant stirring of the suspension because of the strong tendency of the frit particles to settle out. It is well recognized that the effectiveness of electrophoretic deposition is a function of such factors as voltage, the concentration of particles, particle size, and time of deposition. The following ranges of conditions have proven satisfactory in producing desirable coatings:

Voltage: 50–400 dc volts

Concentration of particles: 15–200 grams/100 ml. liquid

Particle size: <325 mesh, preferably 5–20 microns average

Time to achieve 0.006" thick fired coating:
 5 seconds for high concentration of particles
 1 minute for low concentration of particles The deposited coatings are dried and any organic binder optionally present in the vehicle removed by heating to several hundred degrees centigrade. Subsequently, the coated substrates are fired by plunging into a preheated furnace operating at temperatures within the interval of 850°–1000° C.

A typical firing sequence, when the proper temperature has been selected, comprises the vitrification of the deposited particles in a time of about one minute followed by crystallization thereof in the succeeding 20–30 seconds. Crystallization is complete within the next 1.5–2 minutes so that the total sintering time will customarily average about 3–5 minutes. This sequence can be followed visually during the firing by observing changes in opaqueness displayed by the material. Hence, complete vitrification and flow of the frit particles yield a transparent glass body. Opacity is gradually developed therein through the generation of crystals therein.

As was noted above, it is believed that substantially all flow takes place during the short period of the vitrified state. Consequently, the glassy state must manifest adequate fluidity to uniformly and totally cover the substrate. Unlike conventional vitreous glaze coatings, however, the inventive crystallizing coating does not form a meniscus around holes and edges during firing.

Table III reports various electrical properties measured on coatings prepared from several of the working examples recorded in Table I electrophoretically deposited upon 1"×2"×0.045" strips of 430 Ti stainless steel, a titanium-stabilized stainless steel especially resistant to oxidation, utilizing 2-propanol as the vehicle and fired in air at about 925° C. for about four minutes to a thickness of ~0.006".

TABLE III

|  | 2 | 3 | 6 |
|---|---|---|---|
| Volume Resistivity (ohm cm) | 13.89 | 14.01 | 12.87 |
| (Log ρ) | 306° C. | 300° C. | 306° C. |
| Loss Tangent (25° C.) |  |  |  |
| 120 Hz | 0.000 | 0.000 | 0.000 |
| 1KHz | 0.001 | 0.001 | 0.001 |
| 10KHz | 0.001 | 0.001 | 0.001 |
| Dielectric Constant (25° C.) |  |  |  |
| 120 Hz | 8.39 | 8.15 | 5.93 |
| 1KHz | 8.34 | 8.10 | 5.88 |
| 10KHz | 8.33 | 8.09 | 5.88 |
| Dielectric Strength |  |  |  |
| (KV/0.001" thickness) | 1.5 | 1.6 | 2.2 |

We claim:

1. Glass-ceramic coating compositions capable of being fired repeatedly to temperatures greater than 950° C. without undergoing thermal deformation and exhibiting coefficients of thermal expansion (25°–600° C.) between about $75–150 \times 10^{-7}/°C$. which have compositions essentially free from alkali metal oxides and consist essentially, expressed in terms of weight percent on the oxide basis, of:

| | |
|---|---|
| BaO | 10–60 |
| $B_2O_3$ | 5–30 |
| $SiO_2$ | 25–40 |
| $Al_2O_3$ | 0–15 |
| CaO | 0–15 |
| MgO | 10–35 |
| ZnO | 0–16 |
| $Al_2O_3$ + CaO + ZnO | 5–20 |

2. Glass-ceramic coating compositions according to claim 1 consisting essentially of:

| | |
|---|---|
| BaO | 10–40 |
| $B_2O_3$ | 6–25 |
| $SiO_2$ | 25–38 |
| MgO | 10–30 |
| CaO | 0–15 |
| ZnO | 0–16 |
| $Al_2O_3$ | 0–10 |
| CaO + ZnO + $Al_2O_3$ | 5–18 |

* * * * *